United States Patent [19]

Reed et al.

[11] Patent Number: 4,630,239
[45] Date of Patent: Dec. 16, 1986

[54] CHIP SELECT SPEED-UP CIRCUIT FOR A MEMORY

[75] Inventors: Paul A. Reed; Stephen T. Flannagan, both of Austin, Tex.

[73] Assignee: Motorola, Inc., Schaumburg, Ill.

[21] Appl. No.: 750,638

[22] Filed: Jul. 1, 1985

[51] Int. Cl.[4] .................................... Q11C 11/40
[52] U.S. Cl. ............................ 365/189; 365/230; 365/226; 365/203
[58] Field of Search ............ 365/189, 230, 226, 227, 365/203

[56] References Cited

U.S. PATENT DOCUMENTS 4,344,156  8/1982  Eaton, Jr. et al. ............... 365/189

Primary Examiner—Terrell W. Fears
Attorney, Agent, or Firm—John A. Fisher; Jeffrey Van Myers; James L. Clingan, Jr.

[57] ABSTRACT

A memory circuit is provided which has a select and a deselect mode. The memory circuit, as part of its technique for quickly accessing data, includes circuitry for generating a pulse in response to detecting an address transition. When the memory circuit switches from the deselect mode to the select mode, these appears to be an address transition even when there is not an address transition. In order to prevent a delay associated with interpreting such false transition as an actual transition, the detection of address transitions is suppressed for a predetermined delay time following the transition from the select to deselect modes.

12 Claims, 7 Drawing Figures

CHIP SELECT SPEED-UP CIRCUIT FOR A MEMORY

FIELD OF THE INVENTION

The present invention relates to memories which have a chip select function, and more particularly to memories which have the chip select function and which utilize address transition detection.

BACKGROUND OF THE INVENTION

A chip select function has long been used in memories to disable a memory circuit to reduce power consumption. The memory is not responsive to external address signals when deselected by the chip select signal. Although there is power savings, there is also the potential problem of a loss of speed when switching from the deselected mode to the selected mode because the circuitry is powered down and there is a recovery time. One of the major power losses in CMOS is the first input stage for an input signal because it generally must be compatible with TTL signal levels. A logic high TTL signal may be as low as 2.0 volts. Such a logic high, which is suppose to turn off a P channel transistor, will cause the input P channel transistor to be conductive and thus waste power. Consequently, it is desirable to disable the input stage of as many input signals as is feasible during deselect mode. In many modern memories, however, address transition is used for equillibrating bit lines as well as for other functions, for the purpose of increasing the speed of operation which is reflected in lower access times. When an address buffer which receives an external address signal receives a logic low input, the transition from the deselect to select modes will cause the buffer to provide an address transition which is detected as such if the buffer is disabled during the deselect mode. There is then an unnecessary equalization pulse generated as a consequence of the address buffer being disabled during the deselect mode. There is, however, a delay in generating the equalization pulse because there is a delay in enabling the address buffer because there is an unavoidable delay in responding to the chip select signal. This causes a longer access time for the case in which the memory circuit is coming out of the chip select mode than for the case of a address transition during the select mode. The alternative to having the extended access time has been to not disable the address buffers during the deselect mode and incur the additional power loss.

SUMMARY OF THE INVENTION

An object of the present invention is to provide an improved chip select operation for a memory.

Another object of the invention is to provide an improved memory which utilizes address transition detection and which has a chip select operation.

Yet another object of the invention is to provide an improved technique for transferring a memory from a deselect mode to to a select mode.

These and other objects are achieved in a memory circuit which is enabled in response to an occurrence of a chip select signal and which comprises a plurality of address input circuits, a transition detection circuit, and a disabling circuit. Each address input circuit receives an address signal and is enabled in response to an occurrence of the chip select signal. The transition detection circuit detects a transition of an address signal. The disabling circuit disables the transition detection means for a predetermined time period following an occurrence of the chip select signal.

DESCRIPTION OF THE INVENTION

Figure 1:
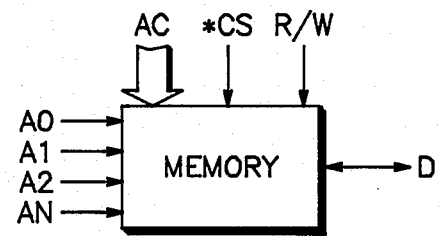
FIG. 1 is an exteral diagram of a conventional memory.

Shown in FIG. 1 is a conventional static random access memory (SRAM) 10 in block form having a plurality of row address signal inputs A0, A1, A2, and AN; column address signals AC, a chip select signal *CS; a data I/O D; and a read/write signal R/W. Chip select signal *CS determines if memory 10 is in an enabled or disabled state. When signal *CS is a logic high memory 10 is disabled and thus deselected. When signal *CS is a logic low, memory 10 is enabled and thus selected. When selected, memory 10 is responsive to the address signals to either read or write data D as determined by signal R/W. Memory 10 is shown as an example of conventional memory with a single data line. Memory 10 can be then, for example a 64K × 1 SRAM. In such case there will be 16 address signals. Some will be row address signals and the others will be column address signals. For address transition detection purposes, a transition of a column address is detected separately from that of row address transition. In many cases the address transition detection is only for a row address transition because equillibration of bit lines is not deemed necessary for a column address change. Address signals A0, A1, A2, and AN are representative of the row address signals. The detection of a row address transition is for equillibrating bit lines but may also be used for other purposes such as enabling decoders.

Figure 2:
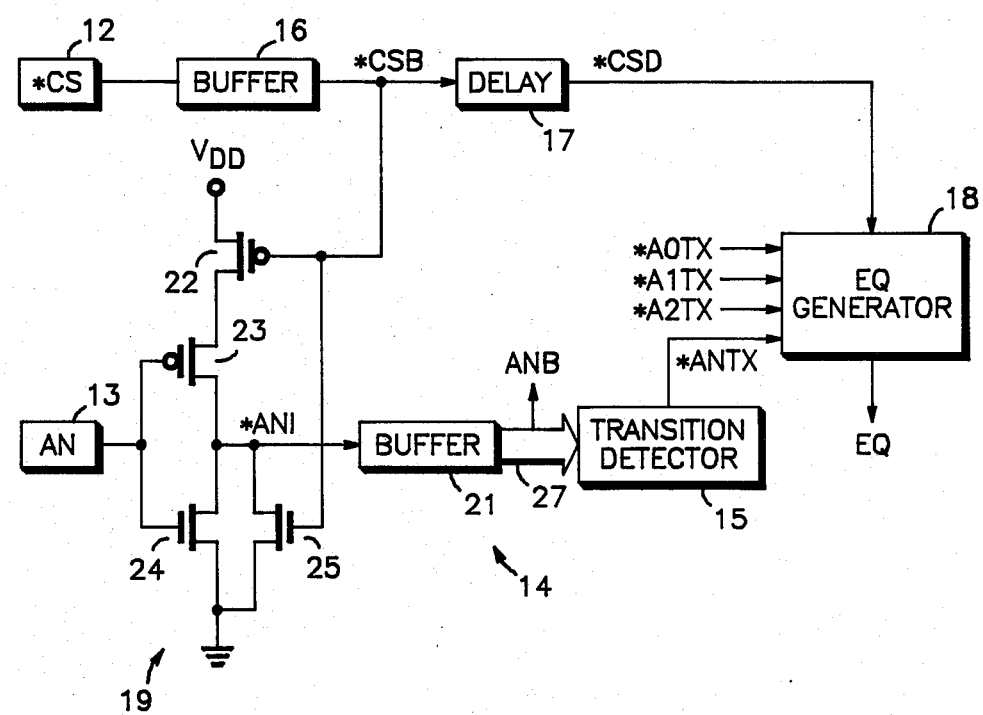
FIG. 2 is combination of circuit and block diagram of a portion of a memory of the prior art.

Shown in FIG. 2 is a circuit 11 of the prior art for use in memory 10, which is used for address transition detection and which uses the chip select signal *CS. Circuit 11 is comprised of an input pad 12 for receiving chip select signal *CS, an input pad 13 for receiving address signal AN, an address input amplifier 14 for providing buffered address signal ANB in response to signal AN, a transition detector 15 for providing an address transition pulse *ANTX in response to a transition of signal ANB, an input buffer 16 for providing a buffered chip select signal *CSB in response to chip select signal *CS, a delay circuit 17 for providing a delayed chip select signal *CSD in response to signal *CSB, and an equalization pulse (EQ) generator 18 for generating an equalization pulse EQ. Amplifier 14 comprises an input circuit 19, and a buffer 21. Input circuit 19 comprises a P channel transistor 22, a P channel transistor 23, an N channel transistor 24, an N channel transistor 25. All of the transistors described herein are insulated gate field effect transistors of the enhancement type. Transistor 22 has a source connected to a positive power supply terminal for receiving, for example, 5 volts, a gate connected to an output of buffer 16 for receiving signal *CSB, and a drain. Transistor 23 has a source connected to the drain of transistor 22, a gate connected to pad 13 for receiving signal AN, and a drain. Transistor 24 has a drain connected to the drain of transistor 23, a gate connected to pad 13 for receiving signal AN, and a source connected to ground. Transistor 25 has a drain connected to the drain of transistor 24, a gate for receiving signal *CSB, and a source connected to ground. Transistors 22-25 which form input circuit 19 also form a conventional CMOS NOR gate.

Figure 3:
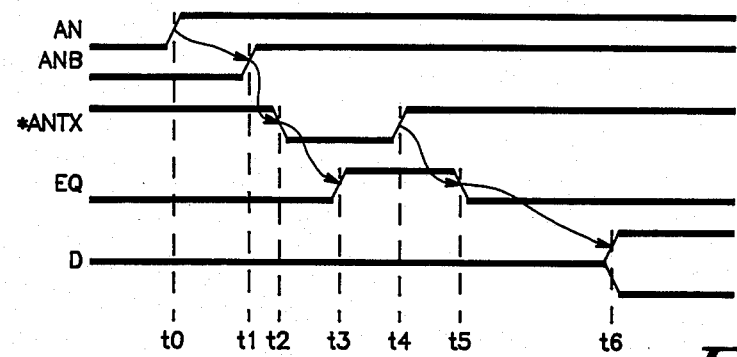
FIG. 3 is a first timing diagram of conventional operation of memory signals.

Transition detector 15 provides pulse *ANTX as a negative going pulse in response to an address transition of signal AN. The asterisk (*) preceding a signal indicates that the signal is active when it is a logic low. Pulse *ANTX is normally a logic high but switches to a logic low for about 8 nanoseconds in response to an address transition of signal AN. EQ generator 18 receives pulse *ANTX and also receives pulses *AOTX, *A1TX, and *A2TX which have the same characteristics as pulse *ANTX except that pulse *AOTX, *A1TX, and *A2TX are active in response to an address transition of address signals A0, A1, and A2, respectively. EQ generator 18 provides a NAND function so that pulse EQ will remain active until all of the input pulses AOTX-ANTX switch to a logic high. A timing diagram of normal operation for a transition of signal AN is shown in FIG. 3. At a time t0, signal AN makes a transition. The particular transition shown is from a logic low to a logic high. Input circuit 19 and buffer 21 respond to switch signal ANB from a logic low to a logic high at a time t1 abous 5 nanoseconds after time t0. Transition detector 15 responds to buffer 21 by causing signal *ANTX to become active (a logic low) at a time t2 about 2 nanoseconds after time t1. Signal *ANTX remains low for about 8 nanoseconds. EQ generator 18 responds by activating pulse EQ at a time t3 about 4 nanoseconds after time t2. When pulse *ANTX switches back to a logic high at time t4, EQ generator 18 responds by causing pulse EQ to switch to a logic low at a time t5 about 4 nanoseconds following time t4. Valid data D appears at a time t6 about 10 nanoseconds following time t5. This is the desired operation. For this example in FIG. 5, the access time, the time from t0 to t6, is 29 nanoseconds. This is given as an example. The actual times are highly dependent upon the actual process used in the manufacturing of the memory. The times given are comparable to those for a high speed state of the art process.

Figure 4:
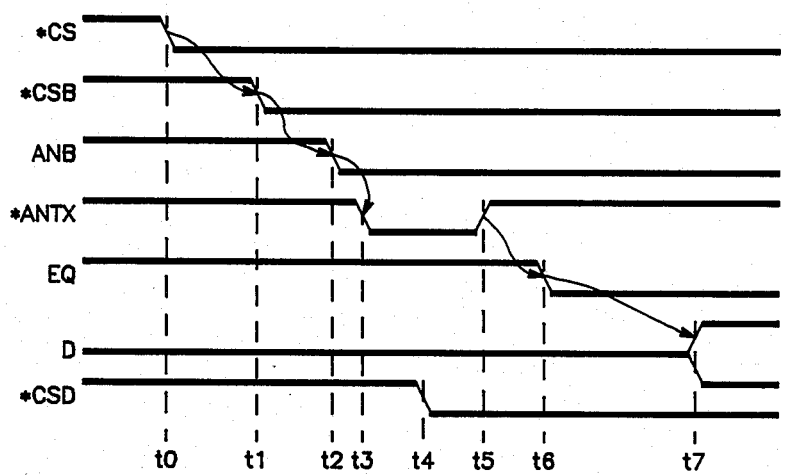
FIG. 4 is a second timing diagram of signals as operated in the prior art.

Shown in FIG. 4 is a timing diagram for the operation of circuit 11 of FIG. 2 when memory 10 comes of the deselect mode. At a time t0, chip select signal *CS switches from a logic high to a logic low so that memory 10 is then selected. Address signal is assumed to be a continuous logic low. With signal AN at a logic low, transistor 24 is non-conductive. Prior to time t0, chip select signal *CS is a logic high so that buffer 16 provides signal *CSB also at a logic high. With signal *CSB at a logic high transistor 25 is conductive and transistor 22 is non-conductive, disabling input circuit 19 and causing signal *ANI to be a logic low. This is the conventional technique which is effective in reducing power loss during the deselect mode. About 5 nanoseconds after signal *CS switches to a logic low, buffer 16 provides signal *CSB to input circuit 19 at a logic low, enabling input circuit 19 by causing transistor 22 to be conductive and transistor 25 to be non-conductive.

With signal AN at a logic low, input circuit 19 responds to signal *CSB switching to a logic low at a time t1 by causing signal *ANI to switch to a logic high. Buffer 21 responds to signal *ANI switching logic state by causing signal ANB to switch logic state at time t2. Transition detector 15 responds to signal ANB switching state by activating pulse *ANTX at a time t3. Buffer 21, generates signals in addition to signal ANB. These additional signals are both true and complementary and have various timing relationships to signal AN. These additional signals are the ones actually coupled to transition detector 15 for the purpose of generating signal *ANTX. These additional signals are shown as being coupled to transition detector 15 via a bus 27. Signal ANB is conveniently used for noting the delay incurred in buffering signal AN. The delay caused by buffer 16 is about 5 nanoseconds. The delay between signal AN and ANB via input circuit 19 and buffer 21 is also about 5 nanoseconds. Consequently, the time between time t0 and time t2 is about 10 nanoseconds. The time delay between signal ANB switching logic state and pulse *ANTX being activated is about 2 nanoseconds so that the time between t2 and t3 is 2 nanoseconds. Because of the switch of signal *CS from a logic high to logic low, signal EQ is a logic high when pulse *ANTX becomes active. Signal *CSD is maintained at a logic low for a predetermined time delay following signal *ANB switching to a logic low. Signal *CSD at a logic high causes pulse EQ to be a logic high. Consequently, during the deselect mode pulse EQ is held at a logic high so that the memory array is equillibrated during the deselect mode. For a transition from the deselect to select modes, pulse EQ is held at a logic high long enough to let the circuitry stabilize. The predetermined delay between signal *CSB and signal *CSD is determined by delay circuit 17. The delay is set sufficiently long to avoid pulse EQ switching to a logic low before signal *ANTX, or some other address transition pulse, would cause it to switch to a logic high. Consequently, the switching of pulse *ANTX to a logic low at time t3 does not cause the activation of pulse EQ because pulse EQ is being held at a logic high by signal *CSD. Signal *CSD switches to a logic low at time t4, releasing EQ generator 18 to the control of the address transition pulses, pulses AOTX ANTX. By the time signal *CSD has released control of EQ generator 18 at time t4, pulse *ANTX has switched to a logic low at time t3, causing pulse EQ to remain at a logic high. Pulse EQ cannot switch to a logic low until, signal *ANTX switches to a logic high at a time t5, about 8 nanoseconds after time t3. Consequently, the elapsed time from t0 to t5 is 20 nanoseconds. Pulse EQ switches to a logic low at a time t6 about 4 nanoseconds after pulse *ANTX switches to a logic high. Valid data follows at a time t7 about 10 nanoseconds after pulse EQ switches to a logic low. Consequently, the access time, the time from t0 to t7 is about 34 nanoseconds for switching from the deselect to select modes. Consequently, the access time for a chip select transition is about 5 nanoseconds longer than the access time for an address transition. The time from the transition of signal ANB to valid data is the same, about 24 nanoseconds, for both cases. The difference is in the time from t0 to the transition of signal ANB. When an access begins by a transition of signal *CS, buffer 16 causes a 5 nanosecond delay before enabling input circuit 19. The enabling of input circuit 19 causes a transition of signal *ANI which in turn causes pulse *ANTX to be activated in the case in which address signal AN is a logic low. Consequently, even though no address transition has occurred, signal *ANTX is activated. This is known as a false address transition. This occurs for address input circuits which are disabled by a chip select signal during the deselect mode. This false address transition only occurs when the address signal is a logic low. When signal AN is a logic high, signal *ANI will be a logic low even when input circuit is disabled because transistor 24 is conductive. Consequently, the enabling of input circuit 19 does not cause a transition of signal *ANI. Of course it is not knowable in which state the addresses will be. The memory must be prepared to handle this false address transition.

This false address transition problem has manifested itself in one of two ways. The access time is extended by about 5 nanoseconds and is specified as such. The access time for a transition from the deselect to select modes is specified as 5 nanoseconds longer than for an access time caused by an address transition during the select mode. The other manifestation has been simply to not disable the input circuits during the deselect mode. This results in higher current during the deselect mode. The deselect mode is also known as standby. Not disabling the input circuits results in specifying a higher standby current.

Figure 5:
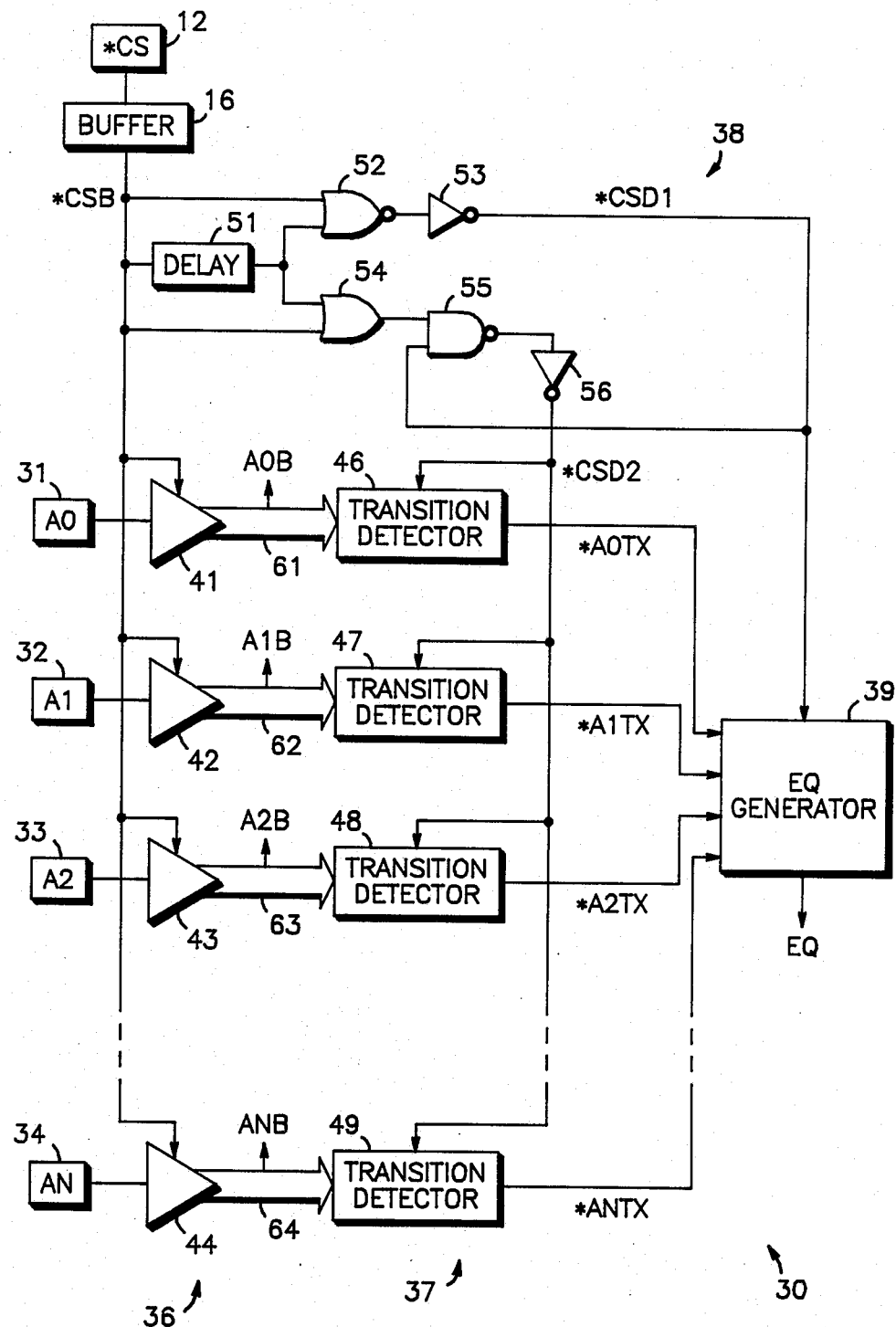
FIG. 5 is a block diagram of a portion of a memory according to a preferred embodiment of the invention.

Shown in FIG. 5 is a circuit 30 according to a preferred embodiment of the invention. Circuit 30 is for replacing circuit 11 in memory 10. Circuit 30 is comprised generally of input pads 12, 31, 32, 33 and 34, the chip select buffer 16, a plurality of address input buffers 36, a plurality of transition detectors 37, a chip select delay circuit 38, and an EQ generator 39. Plurality of input buffers 36 comprises address input amplifiers 41, 42, 43 and 44. Plurality of transition detectors 37 comprises transition detectors 46, 47, 48 and 49. Chip select delay circuit 38 comprises a delay circuit 51, a NOR gate 52, an inverter 53, an OR gate 54, a NAND gate 55, and an inverter 56. NOR gate 52 has a first input for receiving signal *CSB which is generated in the same way as shown in FIG. 2, a second input, and an output. Delay circuit 51 has an input for receiving signal *CSB and an output connected to the second input of NOR gate 52. Inverter 53 has an input connected to the output of NOR gate 52 and an output for providing a first delayed chip select signal *CSD1. OR gate 54 has a first input connected to the output of delay circuit 51, a second input for receiving signal *CSB, and an output. NAND gate 55 has a first input connected to the output of OR gate 54, a second input connected to the output of inverter 53, and an output. Inverter 56 has an input connected to the output of NAND gate 55, and an output for providing a second delayed chip select signal *CSD2. Input pads 31, 32, 33 and 34 receive address signals A0, A1, A2 and AN, respectively. Address input amplifiers 41, 42, 43 and 44 each have an input for receiving a corresponding address signal and an output for providing a buffered address signal. Amplifiers 41, 42, 43 and 44 receive address signals A0, A1, A2 and AN, respectively, and provide corresponding buffered address signals A0B, A1B, A2B and ANB, respectively, as well as other signals via buses 61, 62, 63 and 64, respectively. Address input amplifiers 41-44 each operate the same as address input amplifier 14 of FIG. 2 Each of transition detectors 46, 47, 48 and 49 receive signals relating to corresponding address signals A0, A1, A2 and AN, respectively, via buses 61, 62, 63 and 64, respectively. Transition detectors 46, 47, 48 and 49 are connected to amplifiers 41, 42, 43 and 44, respectively, via buses 61, 62, 63 and 64, respectively. Transition detectors 46-49 each have a control input for receiving signal *CSD2 by being connected to the output of inverter 56. Transition detectors 46, 47, 48 and 49 each have an output for providing an address transition pulse. Transition detectors 46, 47, 48 and 49 provide pulses *A0TX, *A1TX, *A2TX and *ANTX. Transition detectors 46-49 operate substantially the same as transition detector 15 of FIG. 2 except that when signal *CSD2 is a logic high, transition detectors 46-49 are disabled. EQ generator 39 is connected to the outputs of transition detectors 46-49 and the output of inverter 53 and provides signal EQ. EQ generator 39 is functionally the same as EQ generator 18 of FIG. 2.

During normal operation in the select mode in which signal *CSB is a logic low, circuit 30 operates the same as circuit 11 of FIG. 2. An address transition causes pulse EQ and subsequent valid data with the same chain reaction as shown in the timing diagram of FIG. 3. With signal *CSB at a logic low, signals *CSD1 and *CSD2 will also be a logic low. With signal *CSD2 at a logic low, transition detectors 46-49 are enabled so that they will respond to an address transition by activating the corresponding address transition pulse A0TX-ANTX. With signal *CSD at a logic low, EQ generator 39 will respond to an activated address transition pulse A0TX-ANTX by activating pulse EQ.

The improvement over circuit 11 of FIG. 2 is for the case in which a data access is initiated by a transition from the deselect to select modes. Prior to such transition, signal *CSB is a logic high which disables amplifiers 41-44 and causes signals *CSD1 and *CSD2 to be a logic high. With signal *CSD2 a logic high, transition detectors 46-49 are disabled. Pulse EQ is active due to signal *CSD1 being a logic high. When signal *CSB switches to a logic low to cause the switch from the deselect mode to the select mode, amplifiers 41-44 are enabled, causing signals A0B-ANB to assume the logic state of corresponding address signals A0-AN. For the address signals A0-AN which were a logic low at the time of the mode transition, the corresponding buffered address signals will undergo a logic high to logic low transition.

Figure 6:
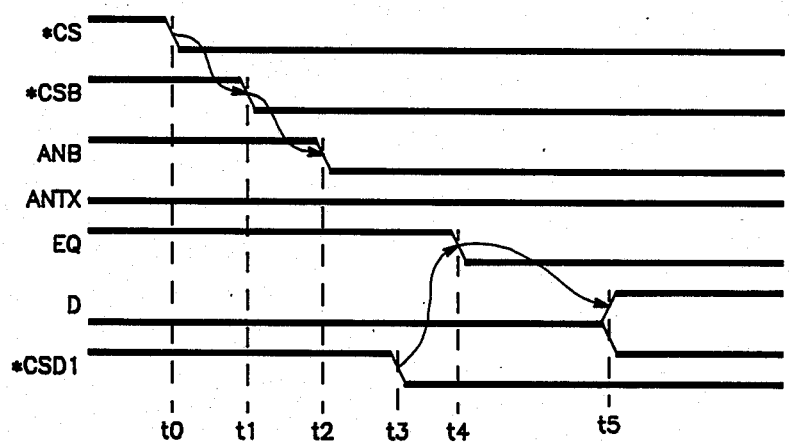
FIG. 6 is a timing diagram of signals as operated in the preferred embodiment of the invention.

Shown in FIG. 6 is a timing diagram for the case in which signal AN is a logic low when signal *CS switches from a logic high to a logic low at a time t0. Signal *CS switching to a logic low causes signal *CSB to switch to a logic low at a time t1 which in turn causes the false transition of signal ANB which switches to a logic low at a time t2. An elapsed time for t0 to t2 in FIG. 6 is the same as that shown in FIG. 4, about 10 nanoseconds. Signal *ANTX, however, is not generated because signal *CSD2 is kept at a logic high sufficiently long to ensure that the false transitions have ceased. Signal *CSD2 will remain at a logic high until both inputs of OR gate 54 are a logic low or until signal *CSD1 switches to a logic low. Both signal *CSD1 and *CSD2 are held to a logic high by delay circuit 51 for a predetermined time delay following signal *CSB switching to a logic low. When signal *CSB switches to a logic low, delay circuit 51 does not output a logic low until the predetermined delay time has elapsed. With NOR gate 52 receiving a logic high for the predetermined delay time, signal *CSD1 will be held at a logic high as well. With the output of delay circuit 51 and signal *CSD1 both at a logic high, signal *CSD2 is also held at a logic high. When the predetermined delay time has elapsed, the output of delay circuit 51 switches to a logic low, causing signals *CSD1 and *CSD2 to switch to a logic low at virtually the same time. In order for access time to be the same for a chip select transition as for an address transition, the time from the chip select transition to signals *CSD1 and *CSD2 switching to a logic low should be the same as the time from the address transition to the termination of the address transition pulse. In terms of the timing diagrams this means that the time from t0 to t4 in FIG. 3 should equal the time from t0 to t3 in FIG. 6. This is achieved by so selecting *CSD1. Alternatively, the delay time for *CSD1 can be reduced so that a chip select transiton access can occur faster than an address transition access.

One delayed chip select signal could be used to both suppress the transition detectors and to generate the equalization pulse for the desired time delay following the chip select transition. This function was achieved in circuit 30 with signals *CSD1 and *CSD2 to provide a margin of safety. Signal *CSD2, which suppresses transition detectors 46-49, will not be generated unless both signal *CSB and signal *CSD1 are a logic high. This guards against the situation in which signal *CSB is a logic high for only a very short time but causes transition detectors to miss an address transition but does not cause the EQ pulse to be active sufficiently long. Circuit 30 causes pulse EQ to be generated by signal *CSD1 switching to a logic high which occurs before signal *CSD2 can suppress transition detectors 46-49. Measures are thus taken to provide sufficient time for pulse EQ to be active for sufficiently long. With two delayed chip select signals, there is also the oppurtunity to continue to suppress *ANTX after initiating the termination of pulse EQ by terminating *CSD1 before terminating *CSD2.

Figure 7:
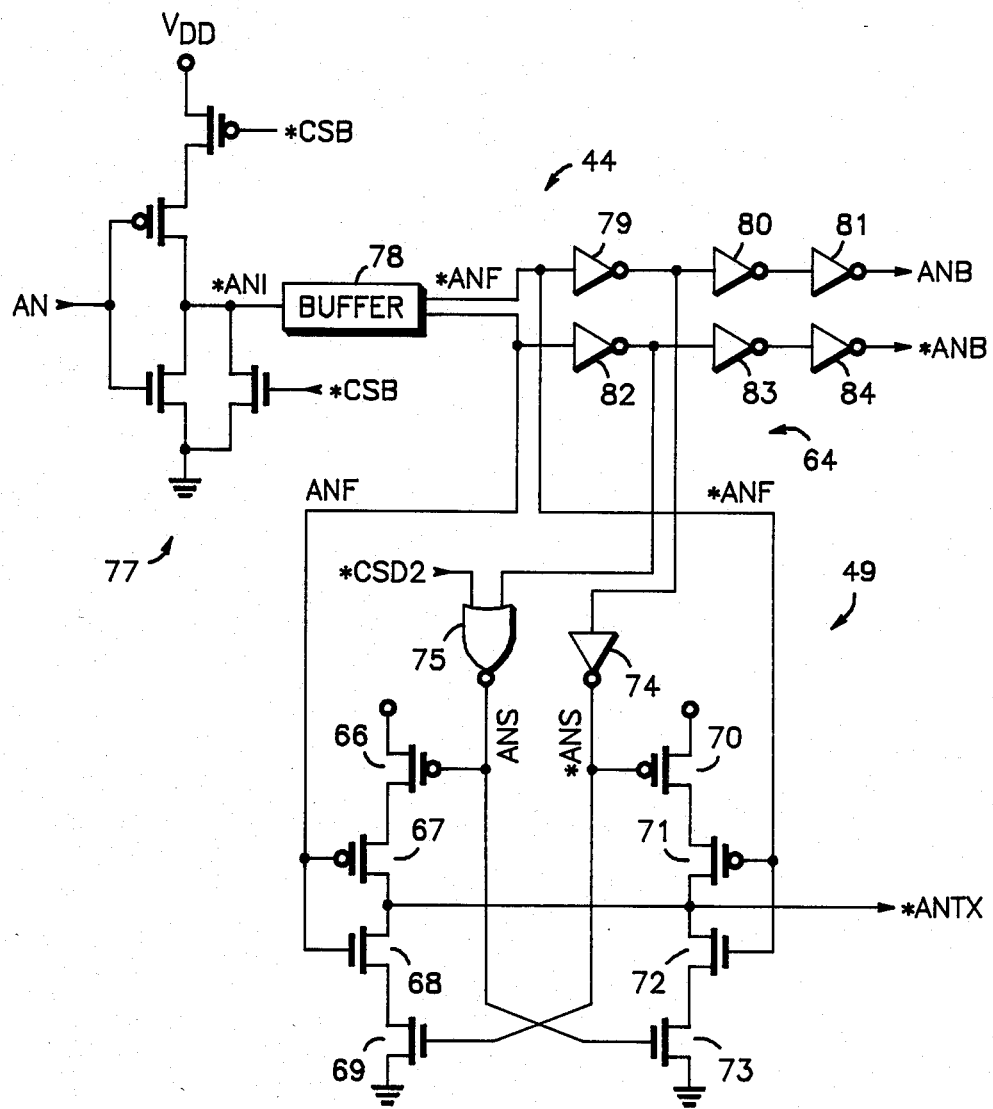
FIG. 7 is a ccircuit diagram of a portion of the block diagram of FIG. 5.

Shown in FIG. 7 is a more detailed drawing of input amplifier 44, transition detector 49, and bus 64. Transition detector 49 comprises transistors 66, 67, 68, 69, 70, 71, 72, 73, inverter 74, and NOR gate 75. Input amplifier 44 comprises an input circuit 77, a buffer circuit 78, and inverters 79, 80, 81, 82, 83 and 84. Bus 64 is simply the connections between amplifier 44 and transition detector 49. Transition detector 49 uses true and complementary fast address signal ANF and *ANF and true and complementary slow address signals ANS and *ANS in conventional fashion to generate pulse *ANTX in response to a transition of signal AN, except that NOR gate 75 would normally be an inverter and would not receive signal *CSD2. When signal *CSD2 is a logic high NOR gate 75 is forced to provide signal ANS at a logic low. A false address transition occurs when signal AN is a logic low during the transition from the deselect to select modes. This false transition imitates the affect of a logic high to logic low address transition. A logic high to logic low address transition results in an occurrence of pulse *ANTX by virtue of signal *ANF switching to a logic high before signal ANS switches to a logic low. Signal *CSD2 at a logic high forces signal ANS to a logic low, effectively suppressing the detection of a logic high to logic low address transition which is the only false address transition. There is no need to suppress the detection of a logic low to logic high address transition because there is no false address transition that imitates a logic low to logic high transition. Accordingly, inverter 74 need not be converted to a NOR gate. Consequently, a conventional transition detector need only have an inverter changed to a NOR gate to respond to the control provided by circuit 38 of FIG. 5. The input of NOR gate 75 which receives signal *CSD2 thus provides transition detector 49 the capability of being controllably suppressed.

What is claimed:

1. A memory circuit which is enabled in response to an occurrence of a chip select signal, comprising:
    a plurality of address input means, each for receiving an address signal and being enabled in response to an occurrence of the chip select signal;
    transition detection means, coupled to the plurality of address input means, for detecting a transition of an address signal; and
    disabling means for disabling the transition detection means a predetermined time delay following an occurrence of the chip select signal.

2. A memory circuit which, in response to a chip select signal switching from a first logic state to a second logic state, provides data selected by a plurality of address signals, comprising:
    a plurality of address input means enabled by the second logic state of the chip select signal and disabled by the first logic state of the chip select signal, each address input means for receiving a corresponding address signal, for providing an output signal representative of the received address signal when enabled by the chip select signal, and for providing the output signal in a predetermined state when disabled by the chip select signal;
    a plurality of transition detection means, each coupled to a corresponding address input means for detecting a transition of the output signal of the corresponding address input means; and
    disabling means for disabling all of the transition detection means for a predetermined time delay following the chip select signal switching from the first logic state to the second logic state.

3. The memory circuit of claim 2 wherein each enabled transition detector means provides an output pulse in response to detecting an address transiton of the output signal of the corresponding address input means.

4. The memory circuit of claim 3 further comprising an equalization pulse generator means, coupled to the plurality of transition detection means, for generating an equalization pulse in response to receiving an output pulse.

5. The memory of claim 4 wherein the disabling means provides a delayed chip select signal when the chip select signal disables the memory circuit.

6. The memory circuit of claim 5 wherein the equalization pulse generator provides the equalization pulse when the delayed chip select signal is present.

7. A memory circuit which is enabled in response to an occurrence of a chip select signal, comprising:
    input means for receiving an address signal and providing an output responsive thereto when enabled by an occurrence of the chip select signal, and providing the output at a predetermined state when disabled by the chip select signal;
    transition detection means, coupled to the input means, for detecting a transition of the address signal; an equalization pulse generator means, coupled to the transition detection means, for generating an equalization pulse in response to the transition detection means detecting a transition of the address signal; and
    control means for preventing the transition detection means from detecting a transition of the address signal for at least a predetermined time delay following an occurrence of the chip select signal and for causing the equalization pulse generator to provide the equalization pulse for at least the predetermined time delay following the occurrence of the chip select signal.

8. A memory circuit which is enabled in response to an occurrence of a chip select signal, comprising:
input means for receiving an address signal and providing an output responsive thereto when enabled by an occurrence of the chip select signal, and providing the output at a predetermined state when disabled by the chip select signal;
transition detection means, coupled to the input means, for detecting a transition of the address signal and providing an output pulse in response thereto;
an equalization pulse generator means, having a first input for receiving the output pulse and a second input for receiving a delayed chip select signal, for generating an equalization pulse in response to receiving the output pulse or the delayed chip select signal;
control means, coupled to the transition detection means and the equalization pulse generator means, for preventing the transition detection means from providing the output pulse for at least a predetermined time delay following an occurrence of the chip select signal and for providing the delayed chip select signal for at least the predetermined time delay following an occurrence of the chip select signal.

9. In a memory circuit which is enabled in response to an occurrence of a chip select signal, and which comprises:
input means for receiving an address signal and providing an output responsive thereto when enabled by an occurrence of the chip select signal, and providing the output at a predetermined state when disabled by the chip select signal;
transition detection means, coupled to the input means, for detecting a transition of the address signal; and
an equalization pulse generator means, coupled to the transition detection means, for generating an equalization pulse in response to the transition detection means detecting a transition of the address signal;
a method comprising the steps of:
preventing the transition detection means from detecting a transition of the address signal for at least a predetermined time delay following an occurrence of the chip select signal.

10. The method of claim 9 further comprising the step of:
providing the equalization pulse for at least the predetermined time delay following the occurrence of the chip select signal.

11. The method of claim 10 further comprising the steps of:
terminating the equalization pulse in response to the termination of a first delay signal; and
terminating the prevention of detecting a transition of the address signal in response to the termination of a second delay signal.

12. The method of claim 11 wherein the first delay signal is terminated prior to the termination of the second delay signal.

* * * * *